(12) United States Patent
Kim et al.

(10) Patent No.: US 12,557,456 B2
(45) Date of Patent: Feb. 17, 2026

(54) DISPLAY MODULE AND METHOD FOR REPAIRING DISPLAY MODULE

(71) Applicant: SAMSUNG ELECTRONICS CO., LTD., Suwon-si (KR)

(72) Inventors: Byungchul Kim, Suwon-si (KR); Doyoung Kwag, Suwon-si (KR); Sangmoo Park, Suwon-si (KR); Wonsik Choi, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 703 days.

(21) Appl. No.: 17/885,164

(22) Filed: Aug. 10, 2022

(65) Prior Publication Data

US 2022/0384675 A1    Dec. 1, 2022

Related U.S. Application Data (63) Continuation of application No. PCT/KR2021/003213, filed on Mar. 16, 2021.

(30) Foreign Application Priority Data

Mar. 20, 2020    (KR) .......... 10-2020-0034631

(51) Int. Cl.
  *H10H 29/03*   (2025.01)
  *H10H 29/01*   (2025.01)
  *H10W 90/00*   (2026.01)

(52) U.S. Cl.
  CPC .......... *H10H 29/03* (2025.01); *H10H 29/012* (2025.01); *H10W 90/00* (2026.01)

(58) Field of Classification Search
  CPC ........ H01L 29/01; H01L 29/012; H01L 20/01
  See application file for complete search history.

(56) References Cited

U.S. PATENT DOCUMENTS

| | | | |
|---|---|---|---|
| 6,909,111 B2 | 6/2005 | Yamagata et al. | |
| 7,744,770 B2 * | 6/2010 | Doi | H01L 21/6835 216/60 |

(Continued)

FOREIGN PATENT DOCUMENTS

| | | | |
|---|---|---|---|
| JP | 4100203 B2 | 6/2008 | |
| JP | 6006758 B2 | 10/2016 | |

(Continued)

OTHER PUBLICATIONS

Office Action issued on Mar. 26, 2024 by the Korean Patent Office for KR Patent Application No. 10-2020-0034631.

(Continued)

*Primary Examiner* — Daniel Luke
(74) *Attorney, Agent, or Firm* — Sughrue Mion, PLLC (57) ABSTRACT

A method for repairing a display module and a display module repaired by the method are provided. The method for repairing a display module includes: detecting light-emitting diode (LED) missing positions on a target substrate; loading the target substrate onto a first stage; loading a transfer substrate onto a second stage; arranging the target substrate and the transfer substrate by operating the first stage and the second stage; and transferring a laser consecutively to the LED missing positions by moving the target substrate and the transfer substrate at a constant speed by operating the first stage and the second stage in a row direction or a column direction.

11 Claims, 10 Drawing Sheets

(56) References Cited

U.S. PATENT DOCUMENTS

| | | | |
|---|---|---|---|
| 7,871,930 B2 | 1/2011 | Yamagata et al. | |
| 8,361,268 B2 * | 1/2013 | Mizuno | H10H 20/018 |
| | | | 156/272.8 |
| 8,953,138 B2 | 2/2015 | Kang et al. | |
| 10,007,188 B2 | 6/2018 | Ebihara | |
| 10,020,420 B2 * | 7/2018 | Zou | H10H 20/857 |
| 10,153,325 B2 * | 12/2018 | Thothadri | H05K 3/305 |
| 10,191,388 B2 | 1/2019 | Ebihara | |
| 10,236,447 B2 | 3/2019 | Danesh et al. | |
| 10,755,958 B2 | 8/2020 | Arai | |
| 11,127,720 B2 * | 9/2021 | Batres | H10H 20/01 |
| 11,337,347 B2 | 5/2022 | Ahn et al. | |
| 11,437,541 B2 * | 9/2022 | Park | G01R 31/2635 |
| 2019/0221466 A1 | 7/2019 | Arai | |
| 2019/0288245 A1 | 9/2019 | Lai et al. | |
| 2019/0357395 A1 | 11/2019 | Ahn et al. | |
| 2021/0272824 A1 | 9/2021 | An et al. | |
| 2022/0108978 A1 * | 4/2022 | Kajiyama | H01L 25/0753 |

FOREIGN PATENT DOCUMENTS

| | | |
|---|---|---|
| JP | 2018-60993 A | 4/2018 |
| JP | 2018-176167 A | 11/2018 |
| JP | 6512252 B2 | 5/2019 |
| KR | 10-0712289 B1 | 4/2007 |
| KR | 10-1890934 B1 | 8/2018 |
| KR | 10-2019-0000886 A | 1/2019 |
| KR | 10-1953645 B1 | 3/2019 |
| KR | 10-1972480 B1 | 4/2019 |
| KR | 10-2019-0057054 A | 5/2019 |
| KR | 10-2019-0108202 A | 9/2019 |
| KR | 10-2019-0131305 A | 11/2019 |

OTHER PUBLICATIONS

Notice of Allowance dated Nov. 26, 2024, issued by the Korean Intellectual Property Office in Korean Patent Application No. 10-2020-0034631.

International Search Report dated Jun. 16, 2021 issued by the International Searching Authority in International Application No. PCT/KR2021/003213 (PCT/ISA/210).

Written Opinion dated Jun. 16, 2021 issued by the International Searching Authority in International Application No. PCT/KR2021/003213 (PCT/ISA/237).

\* cited by examiner

DISPLAY MODULE AND METHOD FOR REPAIRING DISPLAY MODULE

CROSS-REFERENCE TO RELATED APPLICATION(S)

This application is continuation application of International Application No. PCT/KR2021/003213, filed on Mar. 16, 2021, which is based on and claims priority to Korean Patent Application No. 10-2020-0034631, filed on Mar. 20, 2020, in the Korean Intellectual Property Office, the disclosure of which is incorporated by reference herein in its entirety.

BACKGROUND

1. Field

The disclosure relates to a display module and a method for repairing a display module, and more particularly, to a display module which may be repaired through a laser transfer method in case light-emitting diodes (LEDs) are found missing during a process of manufacturing the display module, and a method for repairing a display module.

2. Description of Related Art

LEDs are used not only as light sources for lighting devices, but also widely used as light sources for various display devices of various electronic products such as, for example, and without limitation a television (TV), a mobile phone, a personal computer (PC), a notebook PC, a personal digital assistant (PDA), and other devices with electronic displays.

Recent developments in this technology include research into micro LEDs of a size of less than or equal to 100 μm. These micro LEDs are attracting much attention as light-emitting elements for next generation displays that may have faster response rates, lower energy consumption and higher brightness as compared to LEDs of the related art.

A display module may be manufactured through manufacturing an LED wafer as a chip, and through a transferring and bonding process. Using such manufacturing processes, at least some of LEDs that are produced may have epi defects, chip process defects, transferring and bonding process defects, and/or other manufacturing related defects. These defects may be a cause of defective pixels (a dead pixel or a defective pixel).

For example, when the defective pixels apply a power source to the display module, an off-dot of LEDs not emitting light may occur. The off-dot described above may occur when LEDs are not transferred to a target substrate and are missing by the various defects described above when manufacturing the display module and when the LEDs have been transferred to the target substrate but there is a defective LED itself or by a contact defect between the LEDs and the target substrate.

SUMMARY

Provided are a method for repairing a display module in which the display module which is missing LEDs may be effectively repaired through a laser transfer method and a display module repaired by the method therefrom.

According to an aspect of the disclosure, a method for repairing a display module includes: detecting light-emitting diode (LED) missing positions on a target substrate; loading the target substrate onto a first stage; loading a transfer substrate onto a second stage; arranging the target substrate and the transfer substrate by operating the first stage and the second stage; and transferring a laser consecutively to the LED missing positions by moving the target substrate and the transfer substrate at a constant speed by operating the first stage and the second stage in a row direction or a column direction.

In the transferring, a relative direction of the transferring of the laser and a direction to which the target substrate and the transfer substrate are in movement may be opposite to each other.

In the transferring, the target substrate and the transfer substrate may be configured to move in a same direction.

LEDs may be transferred to the LED missing positions on the target substrate by radiating a laser beam from the laser onto the transfer substrate based on the LED missing positions of the target substrate reaching a laser beam irradiation position while the target substrate and the transfer substrate are in movement.

In the transferring, the direction of transferring is carried out may be back and forth with respect one of the row direction or the column direction.

The transferring may include: first line transferring of transferring LEDs from the transfer substrate to the target substrate while moving the target substrate and the transfer substrate in a first straight-line direction; moving the target substrate and the transfer substrate in an orthogonal direction to the first straight-line direction by a pre-set distance; second line transferring of transferring the LEDs from the transfer substrate to the target substrate while moving the target substrate and the transfer substrate in a second straight-line direction opposite to the first straight-line direction; and moving the target substrate and the transfer substrate in the orthogonal direction by a pre-set distance.

The transfer substrate may be configured such that a portion of multiple LEDs of the transfer substrate is arrayed to be at a position corresponding to LEDs transferred to the target substrate.

The transfer substrate may be manufactured to a size smaller than a size of the target substrate.

The transferring may include carrying out transfer consecutively for respective virtual zones divided on the target substrate.

The multiple LEDs of the transfer substrate may be arrayed to be at a position corresponding to the LEDs transferred to the target substrate.

The transfer substrate may be manufactured to comprise multiple LEDs of a single color.

The transfer substrate may be manufactured to comprise at least a first plurality of LEDs and a second plurality of LEDs, the first plurality of LEDs and the second plurality of LEDs having different colors from one another.

According to an aspect of the disclosure, a display module includes: a glass substrate having a front surface on which a thin film transistor (TFT) layer is disposed and a back surface on which driving circuits configured to operate the TFT layer are disposed; and a plurality of light-emitting diodes (LEDs) electrically connected to the TFT layer of the glass substrate, wherein at least one from among the plurality of LEDs is transferred to an LED missing position of a target substrate by radiating a laser beam to a transfer substrate based on the LED missing position of the target substrate reaching a laser beam irradiation position while moving the target substrate configured to form the glass substrate and the transfer substrate configured to transfer LEDs to the LED missing position on the target substrate in a same direction at a constant speed.

BRIEF DESCRIPTION OF THE DRAWINGS

The above and other aspects, features, and advantages of certain embodiments of the present disclosure will be more apparent from the following description taken in conjunction with the accompanying drawings, in which.

DETAILED DESCRIPTION

Various embodiments will be described in greater detail below with reference to the accompanied drawings. The embodiments described herein may be variously modified. Specific embodiments may be depicted in the drawings and described in detail in the detailed description. However, the specific embodiments described in the accompanied drawings are merely to assist in the understanding of various embodiments. Accordingly, the technical spirit is not limited by the specific embodiments described in the accompanied drawings, and should be interpreted to include all equivalents or alternatives of the embodiments included in the ideas and the technical scopes disclosed herein.

In the disclosure, expressions such as "comprise," "include" or the like are used to designate a presence of a characteristic, number, step, operation, element, component, or a combination thereof, and not to preclude a presence or a possibility of adding one or more of other characteristics, numbers, steps, operations, elements, components or a combination thereof. Terms including ordinals such as "first," and "second" may be used in describing the various elements, but the elements are not to be limited by the above-described terms. The above-described terms may be used only to distinguish one element from another.

A "module" or "part" with respect to the elements used herein may perform at least one function or an operation. Further, the "module" or "part" may perform a function or an operation implemented by a hardware or software, or a combination of hardware and the software. In addition, a plurality of "modules" or a plurality of "parts", except for a "module" or a "part" which needs to be performed from a specific hardware or performed in at least one processor, may be integrated to at least one module. A singular expression includes a plural expression, unless otherwise specified.

In the disclosure, an "epi substrate" (or an epi wafer) may be a substrate on which multiple LEDs are formed by depositing in order a p-type material and an active region, and an n-type material through multiple processes on a growth substrate. A transfer substrate may be a substrate on which multiple LEDs are transported from the epi substrate and arranged to have a predetermined pitch in an X direction and a Y direction as a substrate for transferring the LEDs to a target substrate in positions where LEDs should be located but are missing. The target substrate may be a substrate on which a thin film transistor (TFT) layer and multiple electronic elements are mounted at one surface thereof, and multiple LEDs may be transferred from the transfer substrate. The target substrate transferred with multiple LEDs may form a unit display module. Gaps in the X direction and in the Y direction between respective LEDs arrayed on the target substrate may be referred to as a chip pitch. The chip pitch may be a distance from a center of one LED to a center of another adjacent LED.

In the disclosure, gaps in the X direction and in the Y direction between the respective LEDs arrayed on the target substrate may be referred to as a pixel pitch. Here, the pixel pitch may also be referred to as a display pitch because it corresponds to a final pitch between the respective LEDs which are applied in the display module. The pixel pitch (or display pitch) may be maintained at a gap greater than the chip pitch. The pixel pitch may be a distance from one side of one pixel to one side of another adjacent pixel.

In the disclosure, the "transfer substrate" may be a substrate on which multiple LEDs are transported from the epi substrate and arrayed to have a predetermined pitch in the X direction and in the Y direction. The transfer substrate may be referred to as a temporary substrate. In addition, a process of separating the micro LEDs from a substrate and arranging on the transfer substrate (or may be referred to as one from among a relay substrate, a temporary substrate, or an interposer substrate) may be referred to as an interposer process. In addition, an operation of moving the micro LEDs on the transfer substrate over a display substrate may be referred to as a transfer process.

In the disclosure, a glass substrate may be configured such that multiple self-emissive elements arrayed at a front surface of the glass substrate and side surface wirings which electrically connect circuits positioned at a back surface of the glass substrate may be formed at an edge area of the glass substrate. At the front surface of the glass substrate, a TFT layer formed with TFT circuits may be disposed, and at the back surface of the glass substrate, circuits may not be disposed. The TFT layer may be integrally formed on the glass substrate or manufactured in a film form separate from the glass substrate and attached to one surface of the glass substrate.

In the disclosure, the display module may form a black matrix in between the multiple LEDs arrayed on the TFT layer. The black matrix may enhance a contrast ratio by blocking light from leaking through a periphery of LEDs adjacent with one another. The display module may form a molding part configured to cover both the multiple LEDs and the black matrix. The molding part may be formed of a transparent resin. In this case, the display module may stack and dispose a touch screen over the molding part.

In the disclosure, the glass substrate may include multiple pixels. The respective pixels may include multiple sub pixels and multiple circuits for operating the respective pixels. Here, the sub pixel may be a red LED, a green LED and a blue LED. In the disclosure, the display module may be one from among flat display panels and may be formed with multiple micro LEDs of less than or equal to 100 μm, respectively. The display module of the disclosure may provide better contrast, response time, and energy efficiency compared to a liquid crystal display (LCD) panel which includes a backlight. The micro LEDs which may be an organic LED (OLED) or an inorganic LED may have good energy efficiency and may be brighter, have better light-emitting efficiency and longer lifespan than the OLED.

In the disclosure, although mainly an 'LED' is used in the description, the disclosure is not limited thereto, and the LED may be interchangeably used in a same meaning as an 'LED chip.' In addition, the LED may be configured such that an anode electrode and a cathode electrode are formed at a same surface, and a light-emitting surface may have a flip chip structure formed at an opposite side of the electrodes. The LED may have a predetermined thickness and may be formed as a square type in which a width and length are the same, or as a rectangular type in which the width and length are different.

In the disclosure, the TFT forming the TFT layer (or backplane) may not be limited to a specific structure or type. For example, the TFT referred in the disclosure (i) may be implemented as, for example, and without limitation, an oxide TFT, a Si TFT (e.g., polycrystalline silicon, amorphous silicon), an organic TFT, a graphene TFT, and a low-temperature polycrystalline silicon TFT (LTPS TFT), and (ii) may be applied by manufacturing only a P-type (or N-type) metal oxide semiconductor field effect transistor (MOSFET) in a Si wafer complementary metal oxide semiconductor (CMOS) process.

In the disclosure, a driving circuit included in the display module may be disposed to a pixel area of the TFT layer and implemented by a micro integrated circuit (IC) configured to control operation of at least 2n pixels. When applying the micro IC to the display module, only the micro IC and a channel layer connecting the respective micro LEDs may be formed instead of the TFT on the TFT layer (or backplane).

In the disclosure, a unit configuration in which LEDs are mounted in a circuit area of the TFT layer of the glass substrate may be referred to as the display module. The display module may be a single unit, and installed and applied to a wearable device, a portable device, a handheld device, and other electronic products which may include various displays/display devices. Example display devices include without limitation, a monitor for a personal computer (PC), a high-resolution television (TV), signage (e.g., digital signage), or any electronic display constructed through a plurality of assembly dispositions in a matrix type.

A laser transfer device according to an embodiment of the disclosure and a repair method using the same will be described below. The laser transfer device described in the disclosure may be a laser transfer device for transferring LEDs from the transfer substrate to the target substrate that eliminates a need for a separate laser transfer device for a repair of selectively mounting missing LEDs to the target substrate.

Figure 1:
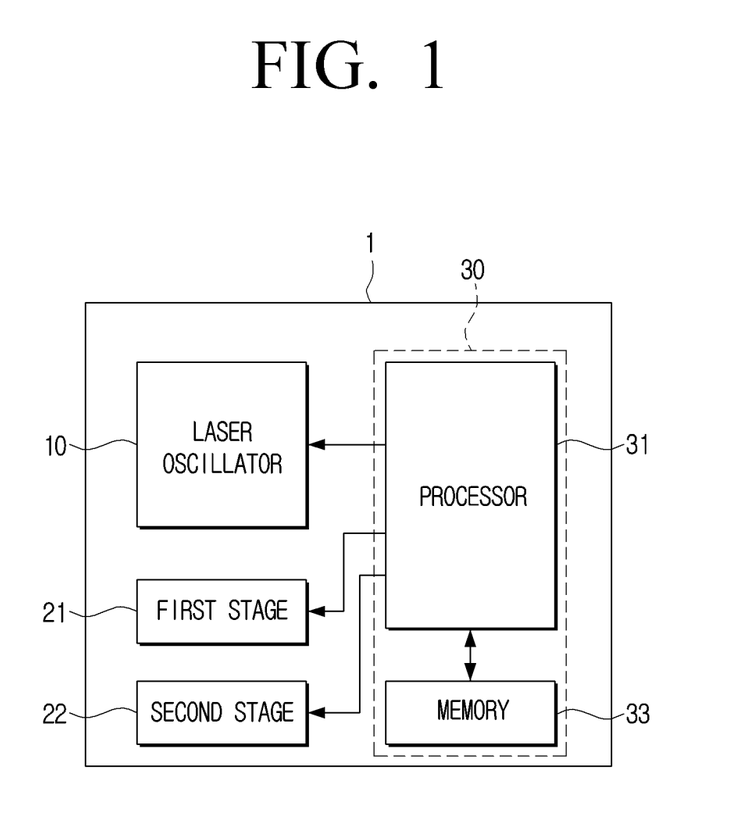
FIG. 1 is a block diagram illustrating schematically a laser transfer device for repair according to an embodiment.

FIG. 1 is a block diagram illustrating schematically a laser transfer device for repair according to the disclosure.

Referring to FIG. 1, the laser transfer device 1 according to an embodiment of the disclosure may include a laser oscillator 10 configured to transfer multiple LEDs disposed in a pre-set array on the transfer substrate to the target substrate, a first stage 21 disposed with a certain gap to a lower side of the laser oscillator 10 and configured to move the transfer substrate used for repairing the LEDs in an X-axis direction, a Y-axis direction, and a Z-axis direction, a second stage 22 disposed at a certain distance from a lower side of the first stage 21 and configured to move the target substrate on which a portion of the LEDs are missing in the X-axis direction, the Y-axis direction, and the Z-axis direction, and a controller 30.

The laser oscillator 10 may be configured to transfer the multiple LEDs arrayed on the transfer substrate to the target substrate by radiating a laser beam towards the transfer substrate. The laser oscillator 10 may transfer the LEDs on the transfer substrate to the target substrate using a laser lift-off (LLO) method. In the transfer process, the target substrate and the transfer substrate may be fixed, and the laser oscillator 10 may move along a pre-designed path to perform the transfer process by scanning the fixed target substrate and the transfer substrate at a certain rate. However, in a repair step, the laser oscillator 10 may be fixed, and substrates may be moved so that a laser beam irradiation position corresponds to an LED missing position.

The first stage 21 may be configured to load the transfer substrate and moving to a predetermined position, such as, for example, and without limitation, an LED transfer position, and a transfer substrate unloading position. The second stage 22 may be configured to load the target substrate and moving to a predetermined position, such as, for example, and without limitation, an LED transfer position, and a target unloading position.

The first stage 21 may include a supporter of roughly a ring shape or a quadrangle frame shape. That is, the first stage 21 may be formed with a periphery configured to grasp an edge part of the transfer substrate and an opening toward an inside of the periphery. The opening may be provided to have a size of an extent so as to not interfere with the LEDs arrayed on the transfer substrate from falling to the target substrate which is positioned at the lower side of the transfer substrate when the laser beam is radiated to the transfer substrate.

The first stage 21 may be moved in the X-axis, the Y-axis, and the Z-axis by a driver. The first stage 21 may be configured to move along a guide rail which is vertically cross-disposed in the X-axis direction and the Y-axis direction, and move in the Z-axis direction together with the guide rail. The first stage 21 may be disposed at an arbitrary position so as to not interfere with the laser oscillator 10 when operating a loading and unloading of the transfer substrate.

The second stage 22 may be formed in a plate shape which does not include an opening unlike the first stage 21.

The second stage 22 may be disposed at a certain distance from the lower part of the first stage 21 when transferring. The second stage 22 may be moved in the X-axis direction, the Y-axis direction, and the Z-axis direction by a different driver than the driver associated with the first stage 21. The second stage 22 may be configured to move along the guide rail which is vertically cross-disposed in the X-axis direction and the Y-axis direction, and move in the Z-axis direction together with the guide rail. The second stage 22 may be disposed at an arbitrary position so as to not interfere with the laser oscillator 10 when operating the loading and unloading of the target substrate.

The controller 30 may be configured to perform transfer by controlling operations of respective configurations of the laser transfer device 1. The controller 30 may be an integrated circuit (IC) or a system on a chip (SoC), and may be a processor 31 and a memory 33. The processor 31 may be configured to execute instructions stored in the memory 33, and perform a manufacturing method of the display module according to various embodiments described in the disclosure. The memory 33 may be stored with various data and instructions.

Figure 2:
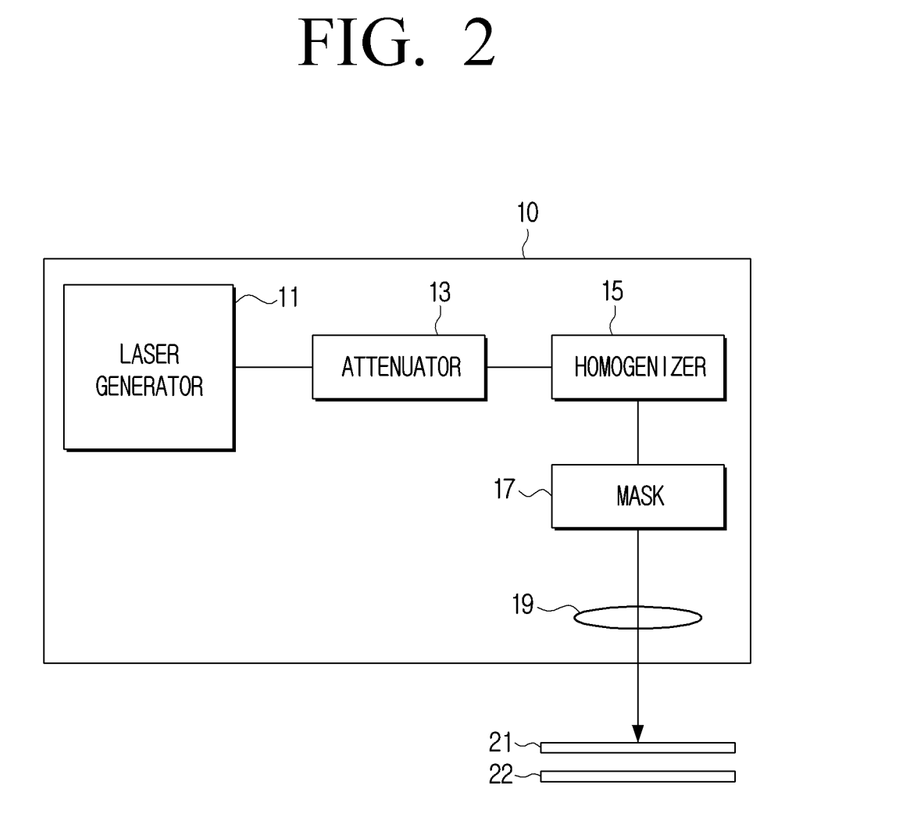
FIG. 2 is a block diagram illustrating schematically a laser oscillator shown in FIG. 1.

FIG. 2 is a block diagram illustrating schematically the laser oscillator shown in FIG. 1.

Referring to FIG. 2, the laser oscillator 10 may include a laser generator 11 configured to generate a laser beam, an attenuator 13 configured to attenuate an intensity of the laser beam output from the laser generator, a homogenizer 15 configured to form the laser beam (which has previously passed through the attenuator) to have an overall uniform distribution, and a projection lens (P-lens) 19 configured to reduce a pattern of the laser beam (which has previously passed through the homogenizer) and to irradiate a transfer area of the transfer substrate (or a substrate for transferring LEDs to the target substrate).

Multiple mirrors may be disposed in between the attenuator 13 and the homogenizer 15, and in between the homogenizer 15 and the P-lens 19 to change a pathway of the laser beam, respectively. One or more of these multiple mirrors may be a galvano mirror. Such a galvano mirror may be a device configured to quickly change a pathway of light from a light source by quickly adjusting an angle of the mirror as it is reflecting the light.

The laser generator 11 may be of various types such as an excimer laser and an ultraviolet (UV) laser according to a wavelength of the laser beam.

The attenuator 13 and the homogenizer 15 may adjust the intensity of the laser beam output from the laser generator 11 by being disposed on an irradiation pathway of the laser beam.

The homogenizer 15 may homogenize the laser beam as a whole based on using, for example, the excimer laser such that a quality of the laser beam passing the P-lens 19 may be made uniform. The homogenizer 15 may make homogenization possible by dividing light with acute changes in luminous intensity into a small light source and then overlapping at a surface which is to be the next target.

The P-lens 19 may focus a patterned laser beam (which has passed through the homogenizer 15) and radiate toward the transfer substrate loaded to the first stage 21. For example, the laser beam radiated toward the transfer substrate may correspond to a point at which a specific LED is disposed to substitute the LED missing on the target substrate.

The mask 17 may be disposed between the homogenizer 15 and the P-lens 19, and may be formed to a size of an extent so as to not affect the surrounding LEDs when the laser beam is radiated to a specific LED of the transfer substrate.

Figure 3:
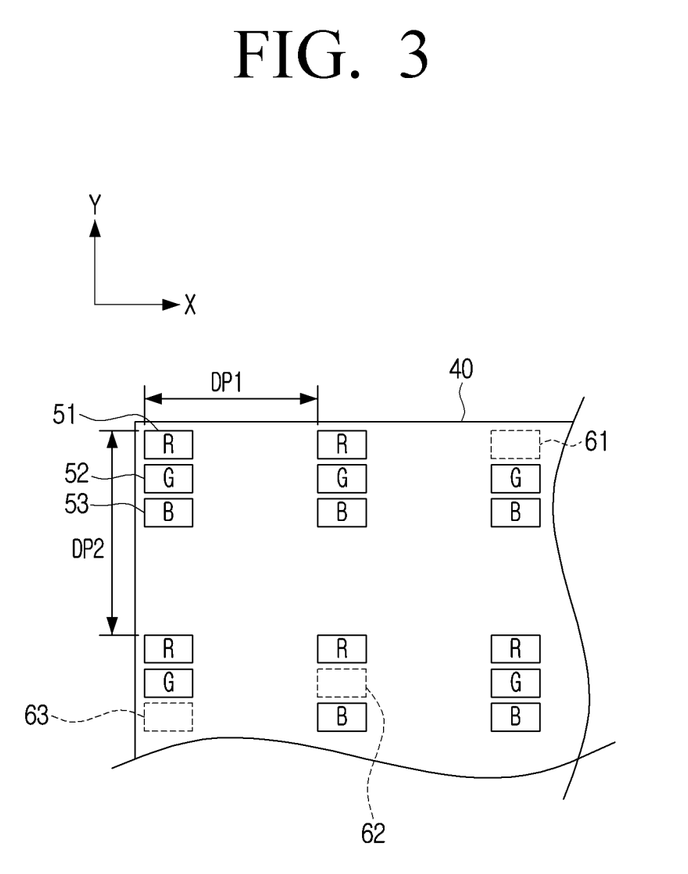
FIG. 3 is a schematic diagram illustrating a state in which a portion of LEDs are missing from a target substrate.

FIG. 3 is a schematic diagram illustrating a state in which a portion of LEDs are missing from the target substrate.

Referring to FIG. 3, the target substrate 40 may be transferred with multiple LEDs from a relay substrate through the laser transfer process. In this case, the target substrate 40 may be transferred with multiple pixels including sub pixels 51 (which may include red, green and blue LEDs) at a first pixel pitch DP1 in a row direction (i.e., X-axis direction) and at a second pixel pitch DP2 in the column direction (i.e., Y-axis direction). However, there may be an instance where a portion of the LEDs are not transferred to the target substrate 40 and are missing during the laser transfer process. For example, as shown in FIG. 3, the positions indicated by reference numerals of 61, 62 and 63 shown on the target substrate 40 may represent the positions where LEDs should be present but are missing.

The laser transfer device 1 may include an inspection device for identifying any positions with missing LEDs. The inspection device may include a visual inspection device and an automatic optical inspection (AOI).

The inspection device may identify a position at which the LEDs are missing on the target substrate 40. Specifically, the inspection device may be configured to (i) carry out inspections of various types including a visual inspection with respect to the multiple LEDs 51 disposed on the target substrate 40 while the target substrate 40 is loaded to the first stage 21, and (ii) identify characteristic information of the multiple LEDs on the target substrate 40. Here, the characteristic information may be at least one from among (i) a measurement value of an output wavelength or brightness, and (ii) an output wavelength, brightness, and performance rating which have been input with respect to the respective LEDs transferred to the target substrate 40.

The processor 31 may be configured to compare the characteristic information of the respective LEDs 51 which have been identified with a pre-set characteristic criterion and identify as the position at which the LEDs are missing when the characteristic information cannot be obtained or there is a significant difference in a characteristic value. The processor 31 may be configured to store position information of the missing LEDs of the target substrate 40 in the memory 33.

However, although the laser transfer device 1 has been described as including the inspection device, embodiments are not limited thereto, and the LED missing position may be detected on the target substrate through the inspection device which may be provided separately from the transfer device 1.

Figure 4:
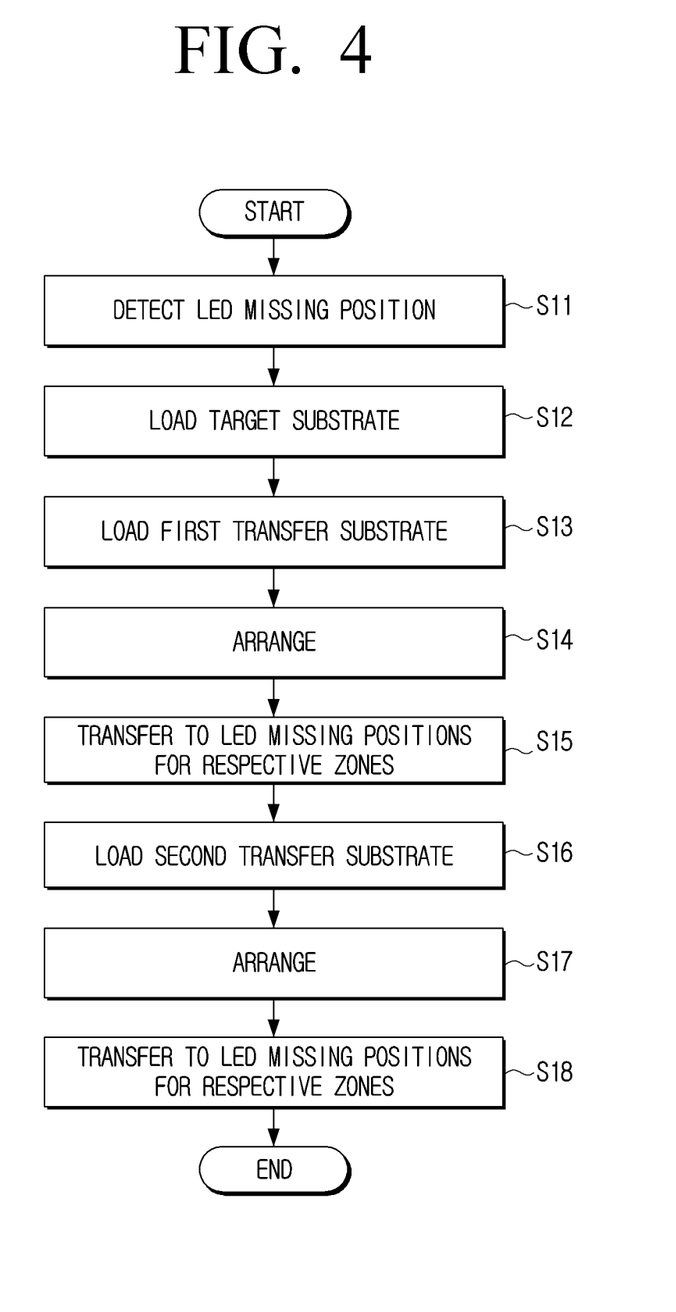
FIG. 4 is a flowchart illustrating a repair method according to an embodiment.
Figure 5:
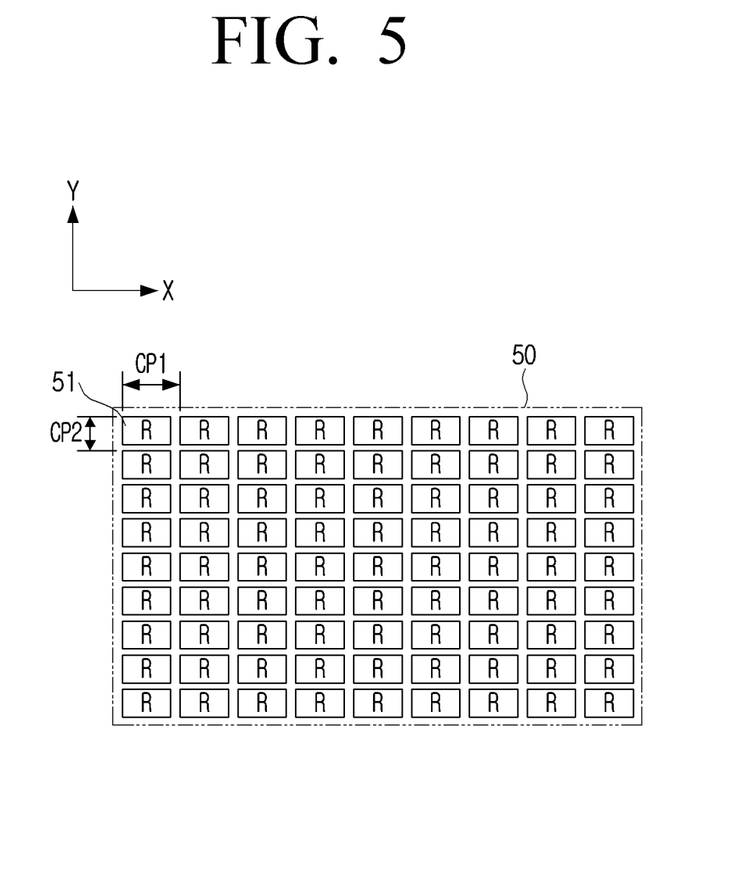
FIG. 5 is a diagram illustrating a transfer substrate used in a repair method according to an embodiment.
Figure 6:
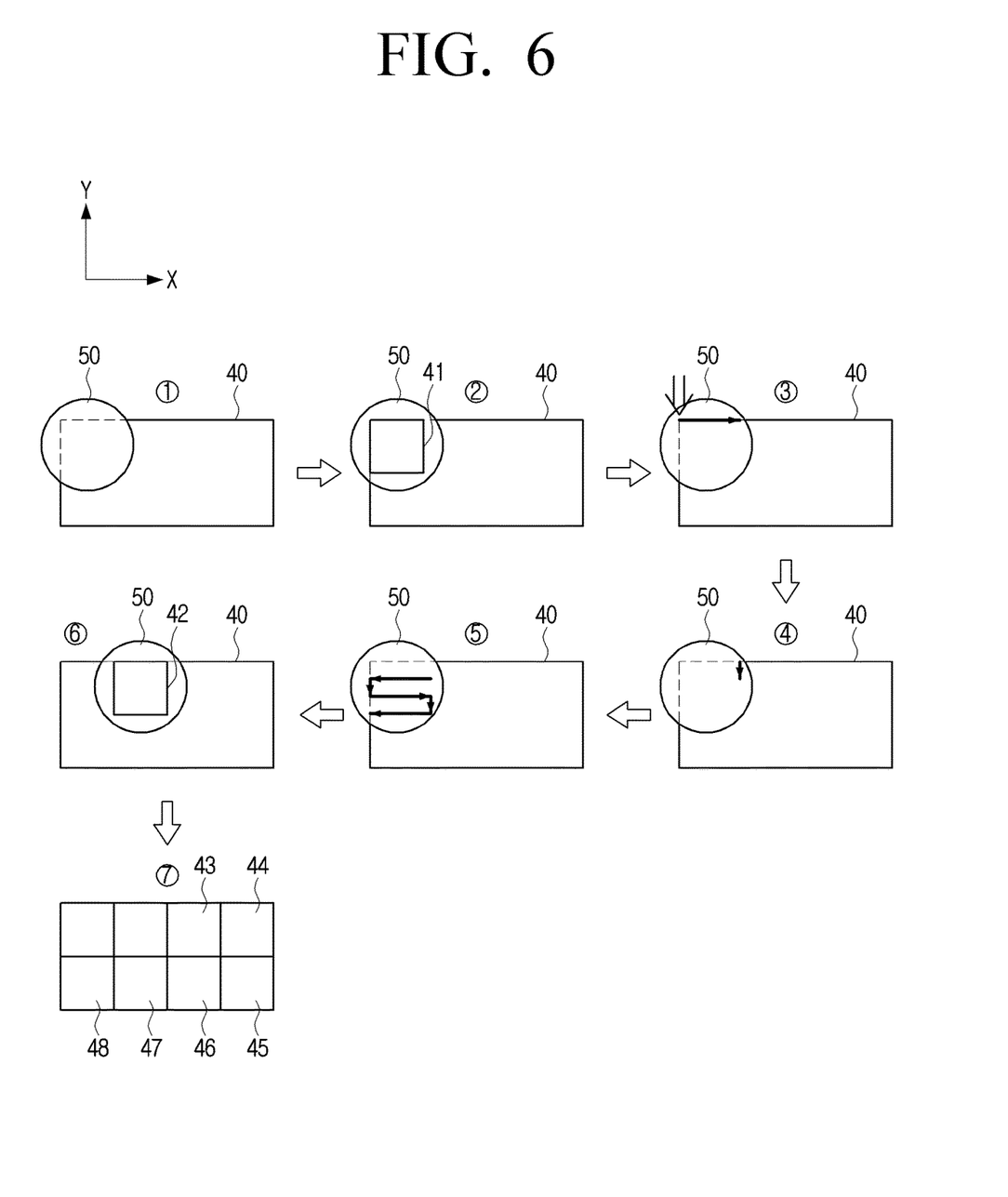
FIG. 6 is a process diagram illustrating a repair method according to an embodiment.

In order to transfer an LED to the position at which the LED is missing on the target substrate, a repair may be carried out in a method as described below. FIG. 4 is a flowchart illustrating a repair method according to an embodiment of the disclosure, FIG. 5 is a diagram illustrating the transfer substrate used in the repair method according to an embodiment of the disclosure, and FIG. 6 is a process diagram illustrating the repair method according to an embodiment of the disclosure.

As shown in FIG. 4, the LED missing position may be detected on the target substrate 40 through the inspection device (S11). In this case, corresponding LED missing position information may be stored in the memory 33. The LED missing position on the target substrate 40 may vary for each target substrate 40 and may indicate one or more missing LED positions per target substrate 40.

The target substrate 40 which has completed detection of the LED missing position may be loaded to the first stage 21 (S12). If a missing LED inspection and a repair process is being consecutively carried out with respect to the target substrate 40, the target substrate 40 may already be loaded onto the first stage 21.

Then, a first transfer substrate 50 provided with LEDs to transfer to the target substrate 40 may be loaded to the second stage 22 (S13).

Referring to FIG. 6, the first transfer substrate 50 may be of a same size as an epi substrate and formed in a wafer form or roughly as a circle.

The first transfer substrate 50 may be provided with LEDs which are all of the same color. For example, red LEDs 51 may be arrayed as in FIG. 5. A second transfer substrate which will be described below may be provided with LEDs of a color different from the red LEDs 51, for example, green LEDs or blue LEDs. As described above, in the disclosure, a repair process may be carried out using a transfer substrate provided with only red LEDs, a transfer substrate provided with only green LEDs, and/or a transfer substrate provided with only blue LEDs.

When the target substrate 40 and the first transfer substrate 50 are loaded onto the first and second stages 21 and 22 respectively, the target substrate 40 and the first transfer substrate 50 may be arranged after moving the target substrate 40 and the first transfer substrate 50 to a predetermined position (e.g., an initial position to start repair) by operating the first and second stages 21 and 22 (S14).

Through the arrangement, the first transfer substrate 50 may be disposed to correspond to a pre-set first zone 41 on the target substrate 40 as in view ② of FIG. 6. The target substrate 40 may be configured such that a whole area of the target substrate is divided into virtual first to eighth zones 41-48 for repair.

Then, when the laser beam is radiated to the pre-set LED missing positions with respect to the respective zones 41-48 of the target substrate 40 while moving the first and second stages 21 and 22 in the same direction at a constant speed, the LEDs of the first transfer substrate 50 may be transferred to the target substrate 40 through laser ablation (S15).

A transfer direction may be an opposite direction with a moving direction of the target substrate 40 and the first transfer substrate 50. Directions of the arrows in a positive X-axis direction and a negative X-axis direction shown in views ③ to ⑤ of FIG. 6 represent the transfer direction. In addition, the directions of the arrows in a −Y-axis direction shown in views ④ and ⑤ of FIG. 6 represent a direction to which a laser transfer position is changed. In this case, the moving direction of the target substrate 40 and the first transfer substrate 50 may proceed in a positive Y-axis direction.

Specifically, the direction of transferring the LEDs from the first zone 41 to the LED missing positions may be carried out from a left end part to a right end part of the first zone in a right-side direction (e.g., positive X-axis direction) as in view ③ of FIG. 6. In this case, because the irradiation position of the laser beam emitted from the laser oscillator 10 is fixed, the irradiation position of the laser beam may be fixed to a certain position.

The target substrate 40 and the first transfer substrate 50 may be concurrently moved by moving the first and second stages 21 and 22 in a straight-line direction toward a left-side direction (e.g., negative X-axis direction) at a constant speed. As described above, when the respective LED missing positions reach the irradiation position of the laser beam while the target substrate 40 and the first transfer substrate 50 are in movement, the LEDs may be transferred to the target substrate 40 by radiating the laser beam to the first transfer substrate 50.

When transferring of the LEDs to the LED missing positions in a first row of the target substrate 40 is completed, the target substrate 40 and the first transfer substrate 50 may be moved by a pre-set distance in an upper direction (e.g., positive Y-axis direction) according to operating of the first and second stages 21 and 22. Accordingly, the laser transfer position of the target substrate 40 and the first transfer substrate 50 may be changed to a lower direction (e.g., negative Y-axis direction) as in view ④ of FIG. 6, and preparation for LED transfer for a second row of the target substrate 40 may be completed.

Then, LED transfer for the LED missing positions present at the second row of the target substrate 40 may be carried out while moving the target substrate 40 and the first transfer substrate 50 in the right-side direction (e.g., positive X-axis direction) at a constant speed according to operating of the first and second stages 21 and 22. In this case, the transfer direction may proceed to the opposite direction to the moving direction of the target substrate 40 and the first transfer substrate 50, that is, in the left-side direction (e.g., negative X-axis direction).

Accordingly, the laser transfer position of the target substrate 40 and the first transfer substrate 50 may be changed to the lower direction (e.g., negative Y-axis direction) as in view ④ of FIG. 6, and preparation for LED transfer for the second row of the target substrate 40 may be completed.

Based on completing the LED transfer to all LED missing positions of the first zone 41 of the target substrate 40 while moving the target substrate 40 and the first transfer substrate 50 in a zigzag (i.e., back and forth) by repeating the process as described above, the first transfer substrate 50 may be moved to a pre-set position corresponding to a second zone 42 of the target substrate as in view ⑥ of FIG. 6.

Then, the LED transfer to all LED missing positions of the second zone 42 of the target substrate may be completed through a same process as the laser transfer method in the first zone 41 of the target substrate 40 as described above. The LED transfer to the LED missing positions of the respective zones may be carried out consecutively in the same method as above with respect to the remaining third zone to eighth zone 43-48 of the target substrate 40.

When the transfer of red LEDs to all red LED missing positions of the first to eighth zones 41 to 48 of the target substrate 40 is completed through the first transfer substrate 50, the first substrate 50 may be unloaded from the second stage 22, and then the second transfer substrate may be loaded to the second stage 22 (S16).

The LEDs provided on the second transfer substrate may be LEDs of a different color, for example, green LEDs or blue LEDs, from the LEDs provided on the first transfer substrate 50.

As described above, the second transfer substrate loaded to the second stage 22 may be arranged to a position corresponding to the first zone 41 of the target substrate 40 (S17).

Then, like the process of transferring the LEDs while moving the target substrate 40 and the first transfer substrate 50 as described above, the green LEDs may be transferred to the green LED missing positions consecutively with respect to the first zone to the eighth zone 41 to 48 of the target substrate 40 (S18).

Based on transferring all green LEDs to the green LED missing positions on the target substrate 40, the blue LEDs may all be transferred to the blue LED missing positions on the target substrate 40 by using a third transfer substrate on which the blue LEDs are provided in the same method as described above and thereby complete the repair.

A method for repairing a display module according to another embodiment of the disclosure will be described below.

Figure 7:
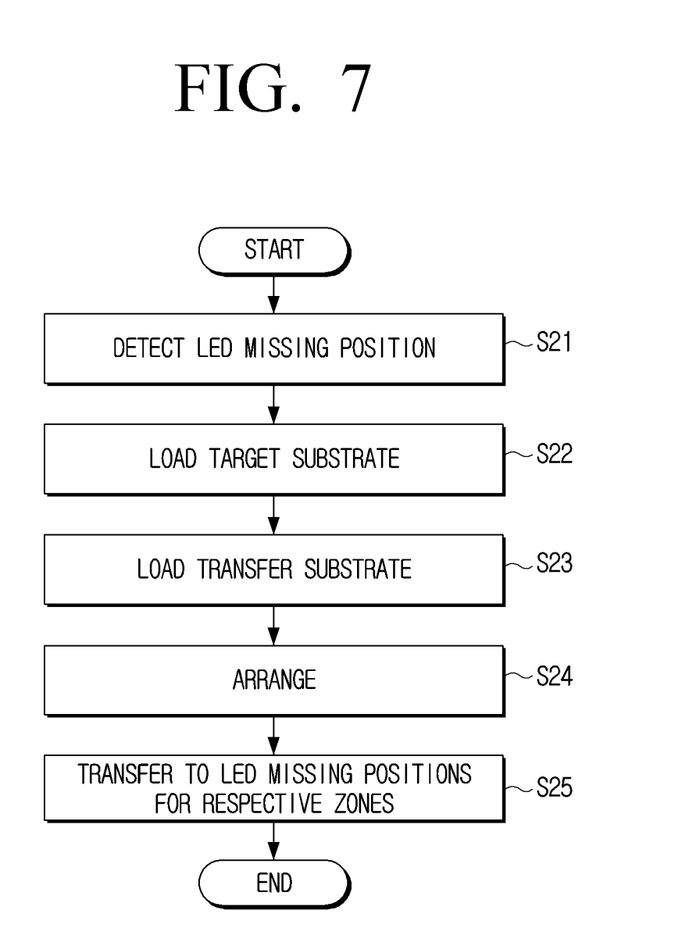
FIG. 7 is a flowchart illustrating a repair method according to another embodiment.
Figure 8A:
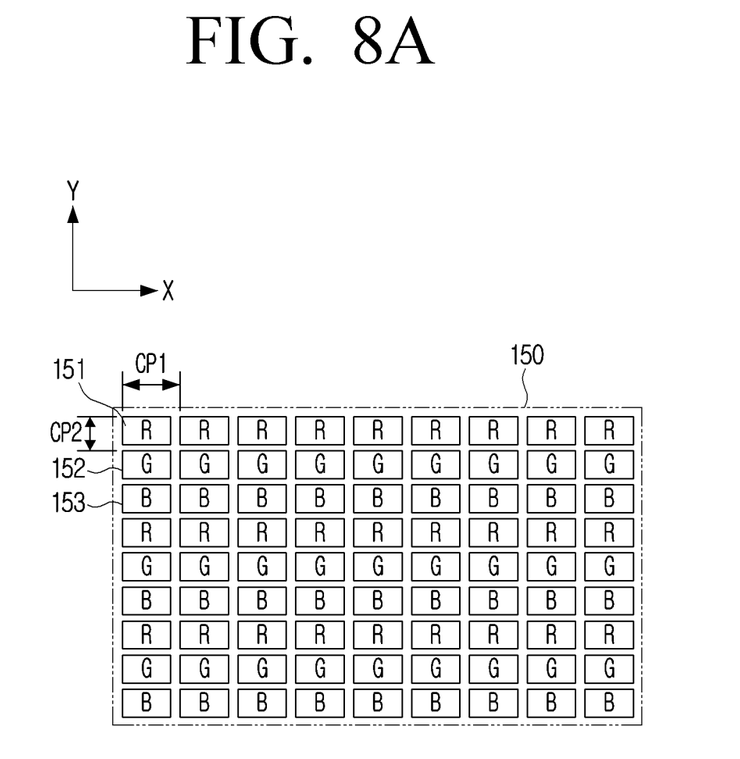
FIG. 8A and FIG. 8B are diagrams illustrating various examples of a transfer substrate used in a repair method according to another embodiment.
Figure 8B:
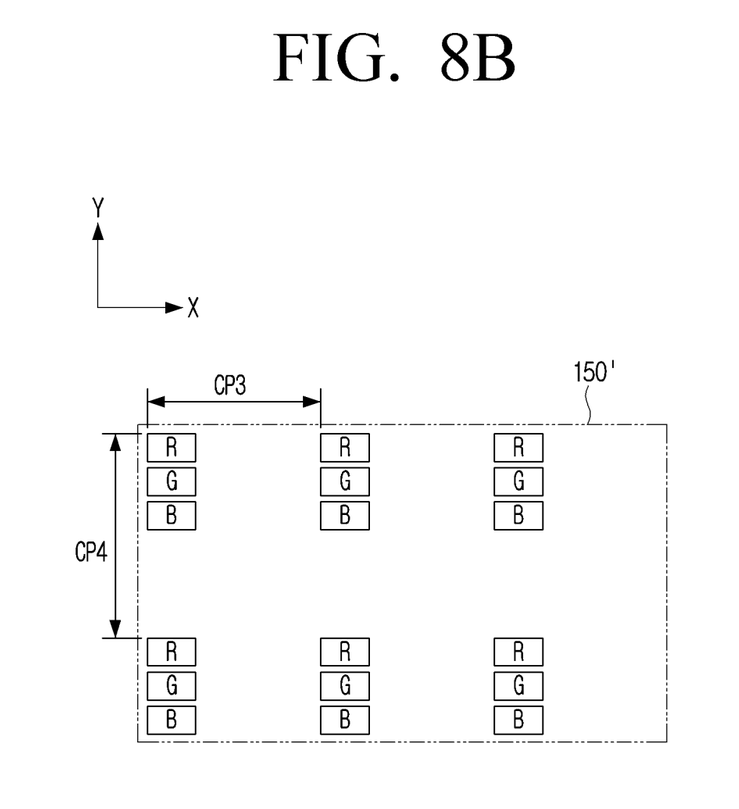
Figure 9:
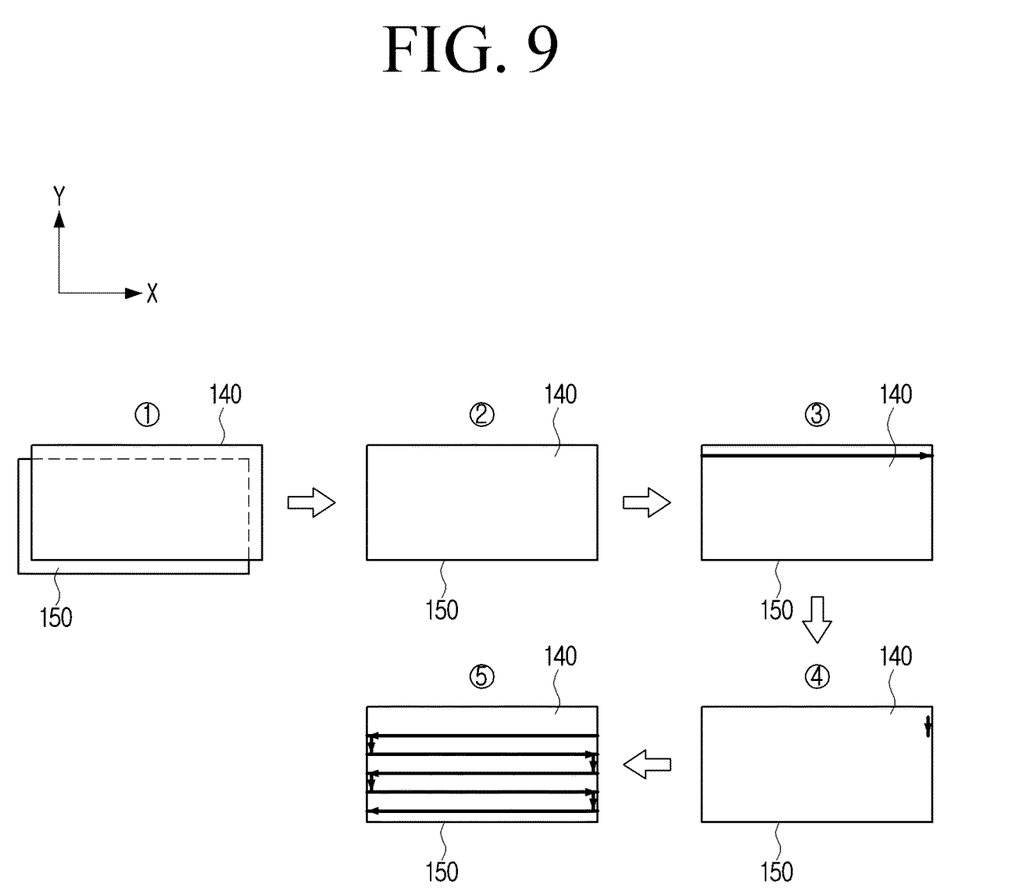
FIG. 9 is a process diagram illustrating a repair method according to another embodiment.

FIG. 7 is a flowchart illustrating a repair method according to another embodiment of the disclosure, FIG. 8A and FIG. 8B are diagrams illustrating various examples of a transfer substrate used in the repair method according to another embodiment of the disclosure, and FIG. 9 is a process diagram illustrating the repair method according to another embodiment of the disclosure.

As shown in FIG. 7, the LED missing positions may be detected on the target substrate 140 through the inspection device (S21). In this case, the corresponding LED missing position information may be stored in the memory 33. The LED missing positions on a target substrate 140 may vary for the respective target substrates 140, and may be one or more in quantity per respective target substrate 140.

The target substrate 140 which has completed detection of the LED missing position may be loaded to the first stage 21 (S22). If the missing LED inspection and the repair process are being consecutively carried out with respect to the target substrate 140, the target substrate 140 may already be in the state loaded to the first stage 21.

A transfer substrate 150 provided with LEDs to transfer to the target substrate 140 may then be loaded to the second stage 22 (S23).

Referring to FIG. 9, the transfer substrate 150 may be formed to a size and shape different from the epi substrate. For example, the transfer substrate 150 may be formed to a size and shape corresponding to the target substrate 140.

The transfer substrate 150 may be arrayed with multiple different colors, for example, red LEDs 151, green LED 152, and blue LEDs 153 (as in FIG. 8A). In this case, the red LEDs 151, the green LED 152, and the blue LEDs 153 may be disposed in a pixel unit along the column direction on the transfer substrate 150.

The respective LEDs of the transfer substrate 150 may maintain a first chip pitch CP1 in the row direction (X-axis direction), and maintain a second chip pitch CP2 in the column direction (Y-axis direction). As described above, the first and second chip pitches CP1 and CP2 may take into consideration the first and second pixel pitches of the target substrate 140. Although the first and second pixel pitches of the target substrate 140 have not been shown, the first and second pixel pitches may correspond to the first and second pixel pitches DP1 and DP2 of the target substrate 40 shown in FIG. 3.

The first and second chip pitches CP1 and CP2 of the transfer substrate 150 and the first and second pixel pitches of the target substrate may have a relationship as described below.

For example, the first chip pitch CP1 of the transfer substrate 150 may correspond to ⅓ of the first pixel pitch DP1, and this may vary according to a horizontal length of the LED. The second chip pitch CP2 may correspond to ⅙ of the second pixel pitch DP2, and this may vary according to a vertical length of the LED.

As described above, in setting the above-described length relationship of the first and second chip pitches CP1 and CP2 corresponding respectively to the first and second pixel pitches DP1 and DP2, a portion of the LEDs on the transfer substrate 150 may match with the position of the LEDs of the target substrate 140 when arranging the target substrate 140 and the transfer substrate 150 in a state in which the transfer substrate 150 is overlapped over the target substrate 140 with a certain distance there between as in view ② of FIG. 9.

Accordingly, when the LED missing positions of the target substrate 140 reach the laser beam irradiation position while moving the target substrate 140 and the transfer substrate 150 in the same direction at a constant speed, the LEDs of the transfer substrate 150 may be transferred to the LED missing positions of the target substrate 140 by transferring the laser beam to the transfer substrate 150.

When the target substrate 140 and the transfer substrate 150 are respectively loaded to the first and second stages 21 and 22, the target substrate 140 and the transfer substrate 150 may be arranged after moving the target substrate 140 and the transfer substrate 150 to a predetermined position (initial position for staring repair) by operating the first and second stages 21 and 22 (S24).

Through the arrangement described above, the target substrate 140 and the transfer substrate 150 may be disposed to match each other as in view ② of FIG. 9. Through the arrangement described above, the LED missing positions of the target substrate 140 may correspond to the LEDs arrayed on the transfer substrate 150, respectively.

Accordingly, the repair method in some arrangements may omit a step of dividing the whole area of the target substrate 140 into virtual zones. In addition, there is no need to substitute to another transfer substrate while repairing the target substrate 140. In addition, there is no need for the transfer substrate 150 to prepare the transfer substrates for the respective LED colors according to the LEDs of multiple colors being arrayed. Based on the advantages described above, production efficiency may be increased and manufacturing costs may be decreased because the above described repair method is able to significantly reduce a takt time and simplify the process.

After the target substrate 140 and the transfer substrate 150 are arranged, the LEDs of the transfer substrate 150 may be transferred to the target substrate 140 by laser ablation when the laser beam is radiated to the pre-set LED missing position of the target substrate 140 while moving the first and second stages 21 and 22 in the same direction at a constant speed (S25).

In the disclosure, the transfer direction may be the arrow directions in the positive X-axis direction and the negative X-axis direction shown in views ③ and ⑤ of FIG. 9, and may be the opposite direction to the moving direction and the transfer direction of the target substrate 140 and the transfer substrate 150. In addition, the arrow direction in the negative Y-axis direction shown in views ④ and ⑤ of FIG. 9 may represent a direction to which the laser transfer position is changed. In this case, the moving direction of the target substrate 140 and the transfer substrate 150 may proceed in the positive Y-axis direction.

Specifically, the direction of transferring the LEDs to the LED missing positions may proceed from the left end part to the right end part of the transfer substrate 150 in the right-side direction (e.g., positive X-axis direction) as in view ③ of FIG. 9. In this case, because the irradiation position of the laser beam emitted from the laser oscillator 10 is fixed, the irradiation position of the laser beam may be fixed at a certain position.

The target substrate 140 and the transfer substrate 150 may be concurrently moved by moving the first and second stages 21 and 22 in a straight-line direction toward the left-side direction (e.g., negative X-axis direction) at a constant speed. As described above, the LEDs may be transferred to the target substrate 140 by radiating the laser beam to the transfer substrate 150 every time the respective LED missing positions reach the irradiation position of the laser beam while the target substrate 140 and the transfer substrate 150 are in movement.

When transferring of the LEDs to the respective LED missing positions is complete in a first row of the target substrate 140, the target substrate 140 and the transfer substrate 150 may be moved in the upper direction (e.g., positive Y-axis direction) by a pre-set distance according to operating of the first and second stages 21 and 22. Accordingly, the laser transfer position of the target substrate 140 and the transfer substrate 150 may be changed to the lower direction (e.g., negative Y-axis direction) as in view ④ of FIG. 9, and preparation for LED transfer for the second row of the target substrate 140 may be completed.

Then, LED transfer for the LED missing positions present at the second row of the target substrate 140 may be carried out while moving the target substrate 140 and the first transfer substrate 150 in the right-side direction (e.g., positive X-axis direction) at a constant speed according to operating of the first and second stages 21 and 22 as in view ⑤ of FIG. 9. In this case, the transfer direction may proceed to the opposite direction to the moving direction of the target substrate 140 and the first transfer substrate 150, that is, in the left-side direction (e.g., negative X-axis direction).

Accordingly, the laser transfer position of the target substrate 140 and the transfer substrate 150 may be changed to the lower direction (e.g., negative Y-axis direction) as in view ⑤ of FIG. 9, and preparation for LED transfer for the second row of the target substrate 140 may be completed.

The LED transfer to all LED missing positions of the target substrate 140 may be completed while moving the target substrate 140 and the transfer substrate 150 back and forth by repeating the process as described above.

As described above, according to another embodiment of the disclosure, not only may the target substrate 150 be formed to correspond to the size and shape of the target substrate 140 making arrangement between the target substrate 140 and the transfer substrate 150 more convenient, but also there may be no need to substitute to another transfer substrate while transferring a line scan to the whole of the target substrate 140.

According to another embodiment of the disclosure, because multi-color LEDs are provided to correspond to the multi-color LEDs arrayed on the target substrate 140, loading of the transfer substrates for the respective colors may be omitted and takt time may be significantly reduced.

In FIG. 8B, another example of a target substrate 150' applicable to another embodiment of the disclosure will be shown.

The transfer substrate 150' may be provided with LEDs of different colors from one another which correspond to the multi-color LEDs of the target substrate 140. The multi-color LEDs provided on the transfer substrate 150' may be arrayed to correspond to a unit pixel formed of red, green and blue LEDs arrayed on the target substrate 140.

That is, the transfer substrate 150 may have a gap corresponding to a row direction pixel pitch (referring to DP1 in FIG. 3) of the target substrate 140 at a third chip pitch CP3 along the row direction (X-axis direction) as in FIG. 8B, and have a gap corresponding to a column direction pixel pitch (referring to DP2 in FIG. 3) of the target substrate 140 at a fourth chip pitch CP4 in the column direction (Y-axis direction). In this case, the fourth chip pitch CP4 may mean a gap from one red LED to a next column direction red LED.

The column direction chip pitch between three LEDs corresponding to the unit pixel on the transfer substrate 150' may correspond to the second chip pitch CP2 shown in FIG. 8A.

As described above, the transfer substrate 150' may be formed in a same array as the array of LEDs transferred to the target substrate 140. In addition, the size and shape of the transfer substrate 150' may be formed to correspond to the size and shape of the target substrate 140.

The repair method according to the embodiments of the disclosure has been described as consecutively proceeding with the laser transfer direction for each row, but is not limited thereto, and may consecutively proceed with the laser transfer direction for each column. For example, transfer may be carried out from the left side to the right side of the target substrate for each column.

While embodiments of the disclosure have been described, it will be understood that the various embodiments are intended to be illustrative, not limiting. It will be understood by those skilled in the art that various changes in form and details may be made therein without departing from the true spirit and full scope of the disclosure, including the appended claims and their equivalents.

What is claimed is:

1. A method for repairing a display module, the method comprising:
    detecting light-emitting diode (LED) missing positions on a target substrate;
    loading the target substrate onto a first stage;
    loading a transfer substrate onto a second stage;
    arranging the target substrate and the transfer substrate by operating the first stage and the second stage; and
    transferring LEDs from the transfer substrate to the LED missing positions of the target substrate by irradiating a laser, while operating the first stage and the second stage to move the target substrate and the transfer substrate at a constant speed, such that the transferring is sequentially performed in a row direction or a column direction.

2. The method of claim 1, wherein in the transferring, a transfer direction in which the LEDs are transferred is opposite to a movement direction in which the target substrate and the transfer substrate are moved.

3. The method of claim 2, wherein in the transferring, the target substrate and the transfer substrate are configured to move in the same movement direction.

4. The method of claim 3, wherein the LEDs are transferred to the LED missing positions on the target substrate by radiating a laser beam from the laser onto the transfer substrate based on the LED missing positions of the target substrate reaching a laser beam irradiation position while the target substrate and the transfer substrate are in movement.

5. The method of claim 1, wherein in the transferring, a transfer direction of transferring the LEDs is carried out back and forth with respect to one of the row direction or the column direction.

6. The method of claim 1, wherein the transferring comprises:
    first line transferring of transferring the LEDs from the transfer substrate to the target substrate while moving the target substrate and the transfer substrate in a first straight-line direction;
    moving the target substrate and the transfer substrate in an orthogonal direction to the first straight-line direction by a pre-set distance;
    second line transferring of transferring the LEDs from the transfer substrate to the target substrate while moving the target substrate and the transfer substrate in a second straight-line direction opposite to the first straight-line direction; and
    moving the target substrate and the transfer substrate in the orthogonal direction by a pre-set distance.

7. The method of claim 1, wherein the transfer substrate is configured such that a portion of multiple LEDs of the transfer substrate is arrayed to be at a position corresponding to the LEDs transferred to the target substrate.

8. The method of claim 7, wherein a size of the transfer substrate is smaller than a size of the target substrate.

9. The method of claim 8, wherein the transferring comprises carrying out transfer consecutively for respective virtual zones divided on the target substrate.

10. The method of claim 7, wherein the multiple LEDs of the transfer substrate are arrayed to be at a position corresponding to the LEDs transferred to the target substrate.

11. The method of claim 1, wherein the transfer substrate is manufactured to comprise multiple LEDs of a single color.

* * * * *